United States Patent
Lee

(10) Patent No.: US 6,952,490 B2
(45) Date of Patent: Oct. 4, 2005

(54) FINGERPRINT RECOGNIZING DEVICE HAVING PATTERNED FLOATING ELECTRODES AND FABRICATING METHOD THEREFOR

(75) Inventor: Ju Hyun Lee, Choongchungnam-do (KR)

(73) Assignee: Testech, Inc., Chunan Si (KR)

( * ) Notice: Subject to any disclaimer, the term of this patent is extended or adjusted under 35 U.S.C. 154(b) by 682 days.

(21) Appl. No.: 09/985,905

(22) Filed: Nov. 6, 2001

(65) Prior Publication Data

US 2002/0054696 A1 May 9, 2002

(30) Foreign Application Priority Data

Nov. 7, 2000 (KR) ........................................ 2000-65706

(51) Int. Cl.[7] ................................................. G06K 9/00
(52) U.S. Cl. .................... 382/124; 382/125; 257/98; 257/103; 313/506
(58) Field of Search .............................. 382/124, 126, 382/125, 127, 116; 257/40, 99, 98, 103, 91, 92; 313/503, 504, 506, 509; 430/531, 961, 536, 533; 356/71; 345/36, 45

(56) References Cited

U.S. PATENT DOCUMENTS

| | | | | |
|---|---|---|---|---|
| 5,892,599 A | | 4/1999 | Bahuguna | ............... 359/15 |
| 5,985,691 A | * | 11/1999 | Basol et al. | ............... 438/95 |
| 6,234,031 B1 | * | 5/2001 | Suga | ............ 73/862.474 |
| 6,411,726 B1 | * | 6/2002 | Pires | ................. 382/124 |
| 6,501,846 B1 | * | 12/2002 | Dickinson et al. | ......... 382/124 |
| 6,525,788 B1 | * | 2/2003 | Nakagawa et al. | .......... 349/44 |
| 6,688,186 B2 | * | 2/2004 | Chae | ............ 73/862.624 |

* cited by examiner

Primary Examiner—Bhavesh M. Mehta
Assistant Examiner—Sheela Chawan
(74) Attorney, Agent, or Firm—Fleshner & Kim LLP

(57) ABSTRACT

A fingerprint recognizing device having patterned floating electrodes is disclosed. The fingerprint recognizing device includes a transparent electrode layer to which one terminal of an AC power source is connected; a light emitting layer for forming an electric field between the transparent electrode layer and a finger forming a ground contact when being contacted with the finger and emitting light by this electric filed for generating an optical fingerprint image according to ridge lines of a fingerprint image; a plurality of patterned floating electrodes arranged on the light emitting layer at a predetermined interval and turned on/off to output the optical fingerprint image; and a transparent insulating layer for transmitting the optical image generated from the light emitting layer.

20 Claims, 4 Drawing Sheets

FINGERPRINT RECOGNIZING DEVICE HAVING PATTERNED FLOATING ELECTRODES AND FABRICATING METHOD THEREFOR

BACKGROUND OF THE INVENTION

1. Field of the Invention

The present invention relates to a fingerprint recognizing device having patterned floating electrodes and a fabricating method therefor, and more particularly, to a fingerprint recognizing device having patterned floating electrodes and a fabricating method therefor which are capable of more clearly generating a fingerprint image generated from the fingerprint recognizing device used for identifying a person.

2. Description of the Related Art

Generally, a fingerprint recognizing device is a device which generates and outputs an image of a fingerprint formed on a finger of a person as an optical image. As disclosed in the Korean Patent Application No. 1998-0036742 "Contact light emitting device and fabricating method therefore and contact input apparatus using the same" and as shown in FIG. 1, the fingerprint recognizing device includes a transparent electrode layer 2 to which one terminal of an AC power source is connected, a light emitting layer 3 formed on the transparent electrode layer 2 and forming an electric field between the transparent electrode layer 2 and a finger 10 forming a ground contact when being contacted with the finger 10 and emitting light by this electric field for generating an optical fingerprint image according to ridge lines 10a of a fingerprint image formed on the finger 10, and a transparent insulating layer 1 formed at the bottom of the transparent electrode layer 2 and for transmitting the optical image generated from the light emitting layer 3.

In the thusly constituted fingerprint recognizing device according to the conventional art, a fingerprint image is outputted as a gray image in a state where the ridge lines 10a of the fingerprint are directly contacted with the surface of the light emitting layer 3. As the fingerprint image is outputted as the gray image, the fingerprint image is not clear in processing the fingerprint image using the optical fingerprint image generated from the fingerprint recognizing device, thus making the processing of the image difficult.

SUMMARY OF THE INVENTION

It is, therefore, an object of the present invention to provide a fingerprint recognizing device having patterned floating electrodes and a fabricating method therefor, in the fingerprint recognizing device having a transparent insulation layer, a transparent electrode layer and a light emitting layer, by forming patterned floating electrodes on a surface of the light emitting layer, a fingerprint image generated to the fingerprint recognizing device is outputted as states of turning on/off.

It is another object of the present invention in which an optical fingerprint image generated to a fingerprint recognizing device is outputted as states of turning on/off, thus making the processing of the optical fingerprint image easier.

To achieve the above object, there is provided a fingerprint recognizing device comprising: a transparent electrode layer to which one terminal of an AC power source is connected; a light emitting layer formed on the transparent electrode layer and forming an electric field between the transparent electrode layer and a finger forming a ground contact when being contacted with the finger and emitting light by this electric field or generating an optical fingerprint image according to ridge lines of a fingerprint image formed on the finger; a plurality of patterned floating electrodes arranged on the surface of the light emitting layer at a predetermined interval and turned on/off to output the optical fingerprint image; and a transparent insulating layer formed at the bottom of the transparent electrode layer and for transmitting the optical image generated from the light emitting layer.

In addition, there is provided a method for fabricating a fingerprint recognizing device comprising the steps of: forming a transparent insulating layer using a transparent insulating material; forming a transparent electrode layer on the transparent insulating layer using a transparent conductive material; mixing 25~35 wt. % dielectric polymer paste, a 25~29 wt. % retarder, and 30~50 wt. % dopant-doped luminous powder and then forming a light emitting layer on the top of the transparent electrode layer using the mixture; and forming a plurality of patterned floating electrodes on the surface of the light emitting layer using a conductive material so that they are spaced at a predetermined interval.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will now be described with reference to the accompanying drawings.

Figure 1:
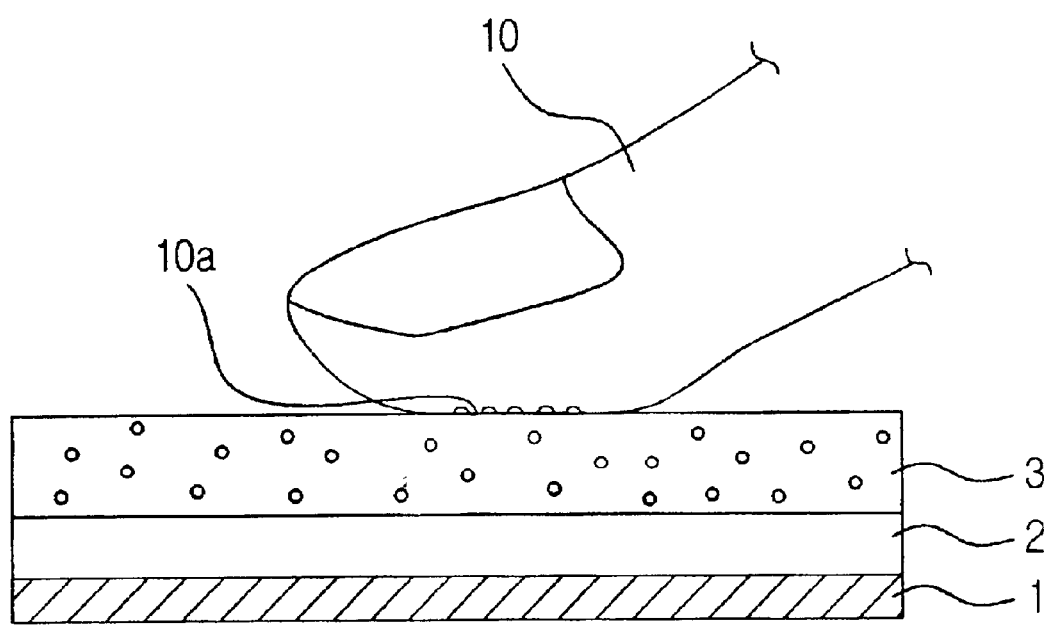
FIG. 1 is a cross-sectional view of a conventional fingerprint recognizing device.
Figure 2:
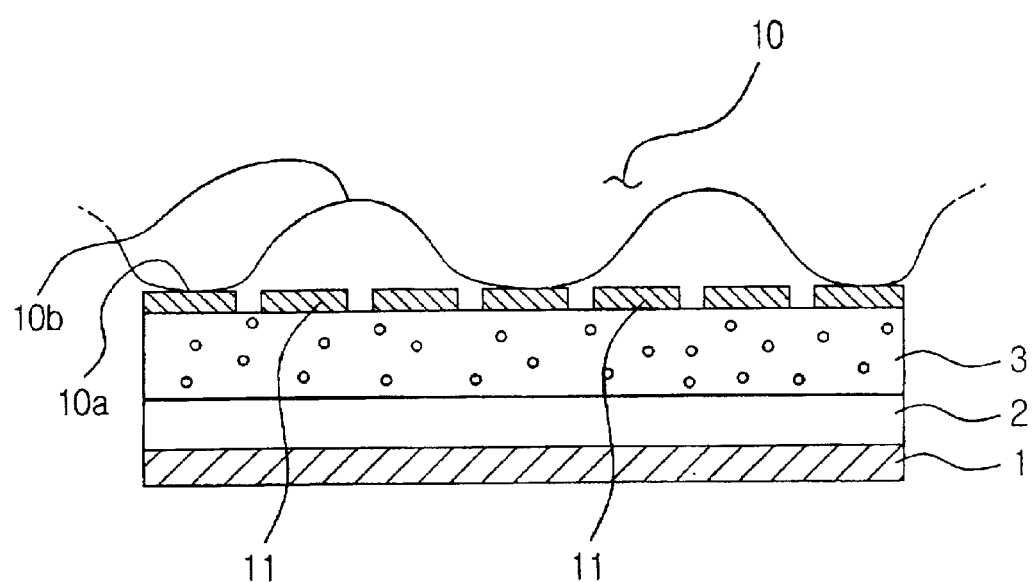
FIG. 2 is a cross-sectional view of a fingerprint recognizing device according to the present invention.
Figure 3:
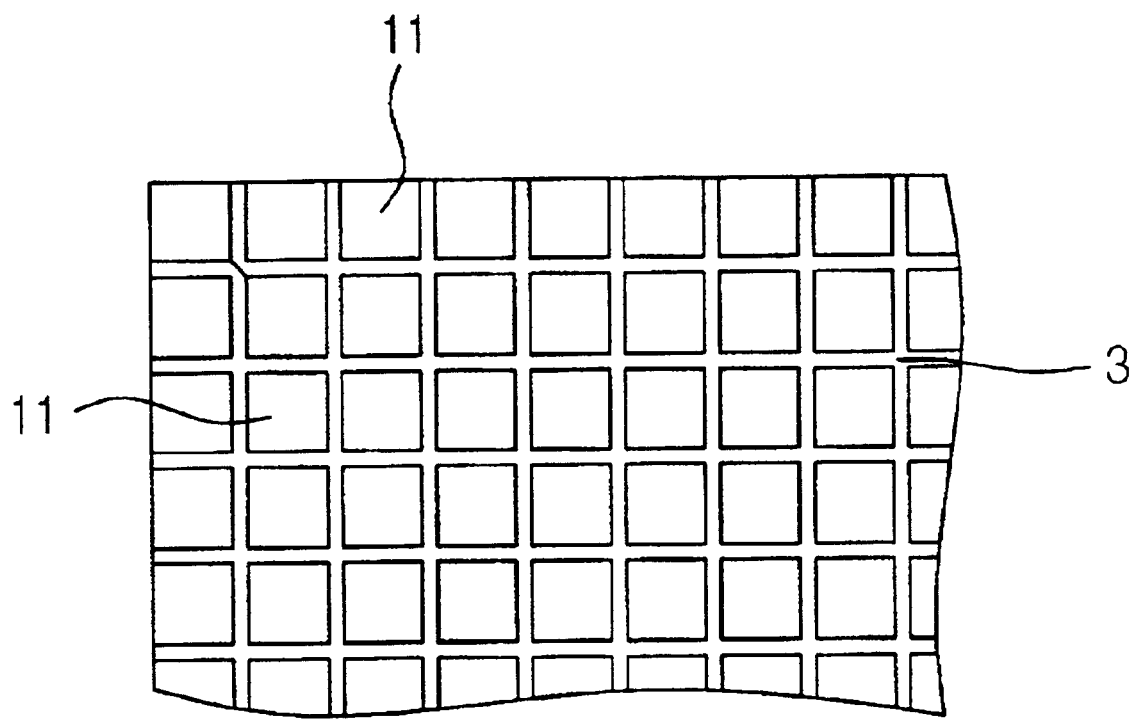
FIG. 3 is a plane view of the fingerprint recognizing device as shown in FIG. 2.

FIG. 2 is a cross-sectional view of a fingerprint recognizing device according to the present invention. FIG. 3 is a plane view of the fingerprint recognizing device as shown in FIG. 2.

As illustrated in FIGS. 2 and 3, the fingerprint recognizing device according to the present invention includes: a transparent electrode layer 2 to which one terminal of an AC power source is connected; a light emitting layer 3 formed on the transparent electrode layer 2 and forming an electric field between the transparent electrode layer 2 and a finger 10 forming a ground contact when being contacted with the finger 10 and emitting light by this electric field for generating an optical fingerprint image according to ridge lines 10a of a fingerprint image formed on the finger 10; a plurality of patterned floating electrodes 11 arranged on the surface of the light emitting layer 3 at a predetermined interval and turned on/off to output the optical fingerprint image and a transparent insulating layer 1 formed at the bottom of the transparent electrode layer 2 and for transmitting the optical image generated from the light emitting layer 3.

That is, the fingerprint recognizing device of the present invention includes a transparent insulating layer 1, a transparent electrode layer 2, a light emitting layer 3 and a plurality of patterned floating electrodes 11. The transparent electrode layer 2 is disposed on the top of the transparent insulating layer 1, the light emitting layer 3 is disposed on the top of the transparent electrode layer 2, and the plurality of patterned floating electrodes 11 are disposed on the top of the light emitting layer 3.

As one terminal of the AC power source is connected to the transparent electrode layer 2 formed on the top of the transparent insulating layer 1, an AC power flows between the transparent electrode layer 2 and the plurality of patterned floating electrodes 11 when DC is supplied to the transparent electrode layer 2. When the finger 10 having ridge lines 10a and a gully 10b formed thereon is contacted to the surface of the plurality of patterned floating electrodes 11, an electric field is formed between the transparent electrode layer 2 and the finger 10.

The electric field formed by such a process results in inducing an electric field between the transparent electrode layer 2 and the plurality of patterned floating electrodes 11. Here, an insulating layer 12 is formed on intervals of the patterned floating electrodes 11 and on the top of the floating electrodes 11 in order to protect the patterned floating electrodes 11.

By the electric field formed between the transparent electrode layer 2 and the plurality of patterned floating electrodes 11, the light emitting layer 3 emits light for thereby generating an optical fingerprint image according to the ridge lines 10a of the finger 10. The fingerprint image generated from the light emitting layer 3 is outputted through the transparent electrode layer 2 and the transparent insulating layer 1. Here, the plurality of patterned floating electrodes 11 are arranged in a lattice pattern in a state of being disposed on the surface of the light emitting layer 3 at a predetermined fine interval.

In this way, by arranging the plurality of patterned floating electrodes 11 on the surface of the light emitting layer 3 in a lattice pattern, one patterned floating electrode 11 serves as one pixel for thereby outputting the optical fingerprint image generated by the light emission of the light emitting layer 3 by turning on/off the floating electrode in unit of pixel. Therefore, the fingerprint image can be processed in unit of pixel, thus making the processing of the image easier.

A fabricating method for the thusly constituted fingerprint recognizing device according to the present invention will now be described.

Firstly, as illustrated in FIG. 2, the step of forming a transparent insulating layer 1 using a transparent insulating material is performed. When the transparent insulating layer 1 is formed, the step of forming a transparent electrode layer 2 on the transparent insulating layer 1 using a transparent conductive material is performed. Then, 25~35 wt. % dielectric polymer paste, a 25~29 wt. % retarder, and 30~50 wt. % dopant-doped luminous powder are mixed and the step for forming a light emitting layer 3 on the top of the transparent electrode layer 2 using the mixture is performed.

Figure 4:
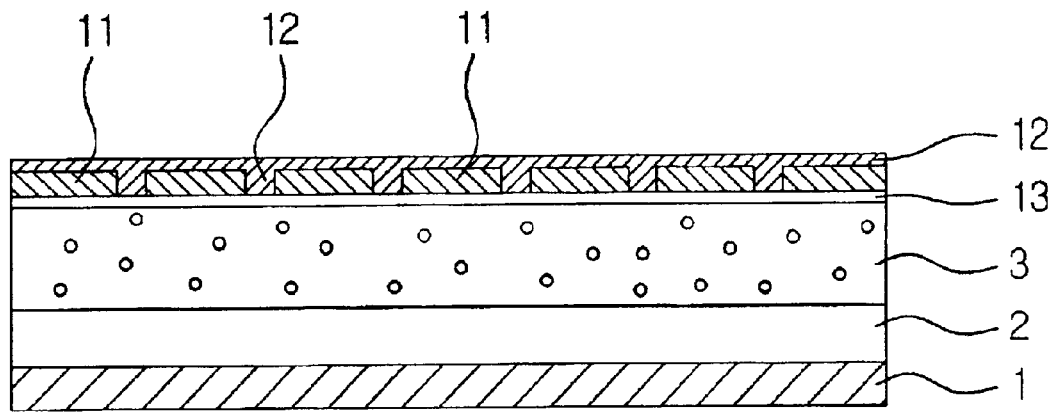
FIG. 4 is a cross-sectional view illustrating a fingerprint recognizing device according to another embodiment of the present invention.

When the light emitting layer 3 is formed, the plurality of patterned floating electrodes are formed on the surface of the light emitting layer 3 using a conductive material so that they are spaced at a predetermined interval. Here, the plurality of patterned floating electrodes 11 are formed on the surface of the light emitting layer 3 in a lattice pattern as illustrated in FIGS. 2 through 4. To prevent penetration by moisture and impurities between the plurality of patterned floating electrodes 11 and to make the floating electrodes stronger against a wet finger by inducting an electric field indirectly, not by directly contacting to the floating electrodes, the insulating layer 12 is formed using an insulating material so that the space between the plurality of patterned floating electrodes 11 can be buried.

The insulating layer 12 is formed of a hydrophobic material and prevents penetration by impurities between the plurality of patterned floating electrodes 11 and makes the floating electrodes 11 stronger against a wet finger. In addition, to increase the luminance of the light emitting layer 3, a dielectric layer 13 instead of the hydrophobic material is formed between the patterned floating electrodes 11 and the light emitting layer 3 as shown in FIG. 4.

As seen from above, by arranging the plurality of patterned floating electrodes 11 on the surface of the light emitting layer 3 in a lattice pattern and forming the insulating layer on the top of the patterned floating electrodes, an optical fingerprint image is generated by turning on/off one patterned floating electrode in unit of pixel, thus making the processing of the image easier.

As explained above, in the fingerprint recognizing device and the fabricating method therefor, by arranging the plurality of patterned floating electrodes 11 on the surface of the light emitting layer 3 in a lattice pattern and forming the insulating layer on the top of top of the patterned floating electrodes, an optical fingerprint image is generated by turning on/off one patterned floating electrode in unit of pixel, thus making the processing of the image easier.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A fingerprint recognizing device comprising:
    a transparent electrode layer to which one terminal of an AC power source is connected;
    a light emitting layer formed on the transparent electrode layer and forming an electric field between the transparent electrode layer and a finger forming a ground contact when being contacted with the finger and emitting light by this electric field for generating an optical fingerprint image according to ridge lines of a fingerprint image formed on the finger;
    a plurality of patterned floating electrodes arranged on the surface of the light emitting layer at a predetermined interval and turned on/off to output the optical fingerprint image; and
    a transparent insulating layer formed at the bottom of the transparent electrode layer and for transmitting the optical image generated from the light emitting layer.

2. The fingerprint recognizing device of claim 1, wherein the device further comprises an insulating layer formed on the upper portions of the floating electrodes in order to prevent the penetration by impurities between the plurality of patterned floating electrodes and make the floating electrodes stronger against a wet finger.

3. The fingerprint recognizing device of claim 1, wherein the device further comprises a dielectric layer formed between the patterned floating electrodes and the light emitting layer in order to increase the luminance of the light emitting layer.

4. The fingerprint recognizing device of claim 1, wherein the transparent electrode layer and the plurality of patterned floating electrodes are configured such that when a finger is placed over the patterned floating electrodes, an electric field is induced between the transparent electrode layer and the plurality of patterned floating electrodes.

5. The fingerprint recognizing device of claim 4, wherein when a finger is placed over the patterned floating electrodes, the electric field strength is strongest between the transparent electrode layer and those patterned floating electrodes that are adjacent fingerprint ridges on the finger.

6. The fingerprint recognizing device of claim 5, wherein an electric field induced between each individual patterned floating electrode and the transparent electrode layer causes the light emitting layer to output light that forms one pixel of an entire image of the fingerprint.

7. The fingerprint recognizing device of claim 1, wherein the plurality of patterned floating electrodes are arranged in a lattice pattern.

8. A method for fabricating a fingerprint recognizing device comprising the steps of:
   forming a transparent insulating layer using a transparent insulating material;
   forming a transparent electrode layer on the transparent insulating layer using a transparent conductive material;
   mixing 25~35 wt. % dielectric polymer paste, a 25~29 wt. % retarder, and 30~50 wt. % dopant-doped luminous powder and then forming a light emitting layer on the top of the transparent electrode layer using the mixture; and
   forming a plurality of patterned floating electrodes on the surface of the light emitting layer using a conductive material so that they are spaced at a predetermined interval.

9. The method of claim 8, wherein the method further comprises a step for forming an insulating layer using an insulating material on upper portions of the floating electrodes so that the space between the plurality of patterned floating electrodes can be buried.

10. The method of claim 9, wherein the insulating layer is formed of a hydrophobic material.

11. The method of claim 8, wherein the method further comprises a step for forming a dielectric layer between the patterned floating electrodes and the light emitting layer in order to increase the luminance of the light emitting layer.

12. A fingerprint recognizing device, comprising:
   a transparent insulating layer,
   a transparent electrode layer formed over the transparent insulating layer, wherein one terminal of an AC power source may be connected to the transparent electrode layer;
   a light emitting layer formed over the transparent electrode layer and configured to emit light when subjected to an electric field; and
   a plurality of patterned floating electrodes arranged over the light emitting layer, wherein when a finger is brought adjacent the plurality of patterned floating electrodes, an electric field is induced between the transparent electrode layer and the plurality of patterned floating electrodes, and wherein the electric field strength is stronger under the individual ones of the plurality of patterned floating electrodes that are located adjacent a fingerprint ridge of the finger.

13. The fingerprint recognizing device of claim 12, wherein an electric field induced between one of the plurality of patterned floating electrodes and the transparent electrode layer causes a portion of the light emitting layer underlying the patterned floating electrode to output a pixel of light.

14. The fingerprint recognizing device of claim 13, wherein pixels of light output by those portions of the light emitting layer underlying patterned floating electrodes that are adjacent fingerprint ridges of a finger form an optical image of the fingerprint of the finger.

15. The fingerprint recognizing device of claim 12, further comprising a dielectric layer formed between the plurality of patterned floating electrodes and the transparent electrode layer.

16. The fingerprint recognizing device of claim 15, further comprising an insulating layer formed between and over the plurality of patterned floating electrodes.

17. The fingerprint recognizing device of claim 12, further comprising an insulating layer formed between and over the plurality of patterned floating electrodes.

18. The fingerprint recognizing device of claim 12, wherein the light emitting layer comprises approximately 25–35 wt. % of a dielectric polymer paste, approximately 25–29 wt. % of a retarder, and approximately 30–50 wt. % of a dopant-doped luminous powder.

19. The fingerprint recognizing device of claim 12, wherein the plurality of patterned floating electrodes are arranged in a lattice pattern.

20. The fingerprint recognizing device of claim 12, wherein the plurality of patterned floating electrodes are not electrically connected to any power source.

* * * * *